(12) United States Patent  
Lai et al.

(10) Patent No.: US 8,441,384 B2
(45) Date of Patent: May 14, 2013

(54) SWITCHED-CAPACITOR CIRCUIT WITH LOW SIGNAL DEGRADATION

(75) Inventors: Fang-Shi Lai, Chia Yi (TW); Manoj M. Mhala, Hsinchu (TW); Yung-Fu Lin, Hsinchu (TW); Hsu-Feng Hsueh, Tainan (TW); Chin-Hao Chang, Hsinchu (TW); Cheng Yen Weng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 146 days.

(21) Appl. No.: 13/030,862

(22) Filed: Feb. 18, 2011

(65) Prior Publication Data

US 2012/0212361 A1   Aug. 23, 2012

(51) Int. Cl.
*H03M 3/00*   (2006.01)

(52) U.S. Cl.
USPC ............................. 341/143; 341/155; 341/172

(58) Field of Classification Search ............... 341/143, 341/155, 144; 327/94, 95
See application file for complete search history.

(56) References Cited

U.S. PATENT DOCUMENTS

| | | | |
|---|---|---|---|
| 5,736,895 A | 4/1998 | Yu et al. | |
| 5,963,156 A * | 10/1999 | Lewicki et al. | 341/122 |
| 6,570,519 B1 | 5/2003 | Yang | |
| 6,573,785 B1 * | 6/2003 | Callicotte et al. | 330/9 |
| 6,617,908 B1 | 9/2003 | Thomsen et al. | |
| 6,642,751 B1 * | 11/2003 | Quinn | 327/94 |
| 6,972,705 B1 * | 12/2005 | Fei et al. | 341/143 |
| 7,009,549 B1 | 3/2006 | Corsi | |
| 2009/0267816 A1 | 10/2009 | Kumamoto et al. | |
| 2010/0109925 A1 | 5/2010 | Vampola et al. | |
| 2010/0254210 A1 | 10/2010 | Liaw | |

OTHER PUBLICATIONS

Yoshihisa Fujimoto et al., "A 100 MS/s 4 MHz Bandwidth 70 dB SNR ΔΣ ADC in 90 nm CMOS", IEEE Journal of Solid-State Circuits, vol. 44, No. 6, Jun. 2009, pp. 1697-1708.

* cited by examiner

*Primary Examiner* — Brian Young
(74) *Attorney, Agent, or Firm* — Haynes and Boone, LLP

(57) ABSTRACT

A switched-capacitor circuit is disclosed. The switched-capacitor circuit includes a comparator having a first and second input, a first and second sampling capacitor, and a first and second switching circuitry. The first switching circuitry charges the first and second sampling capacitor with an input signal. The second switching circuitry selectively couples the first sampling capacitor with a reference voltage and selectively couples the second sampling capacitor and the first and second input of the comparator to a common voltage. The comparator performs a compare of the input signals against the reference voltage, and outputs a signal.

27 Claims, 3 Drawing Sheets

SWITCHED-CAPACITOR CIRCUIT WITH LOW SIGNAL DEGRADATION

BACKGROUND

A switched capacitor is an electronic circuit element used for discrete time signal processing. Switched-capacitor circuits can be used, for example, as adders (or summers) in a sigma-delta modulator, which can be used in analog-to-digital and digital-to-analog converters, frequency synthesizers, switched-mode power supplies, and motor controls. In some examples, the switched-capacitor circuit utilizes an operational amplifier. An advantage of utilizing an operation amplifier is that it does not have gain decrease, due to the utilization of the operational amplifier. However, such an architecture has the disadvantage of a limited input voltage range and a nonlinear response. In other examples, the switched-capacitor circuit does not utilize an operational amplifier. Although such an architecture can have a greater input voltage range and a linear response, the architecture has the disadvantage of a gain decrease due to the capacitor ratio.

In order to improve the linearity of the sigma-delta modulator, it may be desirable to utilize a circuit architecture such that the distortion performance of the sigma-delta modulator is not adversely affected, i.e., the response is linear. Also, to maintain low offset characteristics of the sigma-delta modulator it may be desirable to have the switched-capacitor circuit perform such that it has minimal gain decrease.

Accordingly, new circuits and methods are desired to solve the above problems.

SUMMARY

The present disclosure provides a switched-capacitor circuit structure. In one embodiment, the switched-capacitor circuit includes a comparator having first and second input terminals and an output, and first and second circuits. The first circuit is connected to the first input terminal, and includes first, second, and third switches and a first capacitor. The first switch is connected between a first node of the first capacitor and a common voltage, the first node of the first capacitor also being connected to the first input, the second switch is connected between a second node of the first capacitor and a reference voltage, and the third switch is connected between the second node of the first capacitor and a first input of the switched-capacitor circuit. The second circuit is connected to the second input terminal, and includes fourth, fifth, and sixth switches and a second capacitor. The fourth switch is connected between a first node of the second capacitor and the common voltage, the first node of the second capacitor also being connected to the second input, the fifth switch is connected between a second node of the second capacitor and the common voltage, and the sixth switch is connected between the second node of the second capacitor and a second input of the switched-capacitor circuit. The first, second, fourth and fifth switches are controlled by a first set of switching signals.

The present disclosure also provides a two-stage switched-capacitor circuit structure. In one embodiment, the two-stage switched-capacitor circuit includes a first switched-capacitor circuit and plurality of second switched-capacitor circuits arranged in parallel. The first switched-capacitor circuit has first and second input terminals and an output and further includes an operational amplifier having an input summing node and an output. The first switched-capacitor circuit also includes a first and second sampling capacitor connected to the input summing node and an integrating capacitor connected to the output of the operational amplifier in a feedback loop. The first switched-capacitor circuit also includes a first switching circuitry and a second switching circuitry. The first switching circuitry Is for selectively coupling the first input terminal to the first sampling capacitor and for selectively coupling the second input terminal to the second sampling capacitor, and for selectively coupling the integrating capacitor to the input summing node. The second switching circuitry is for selectively coupling the first and second sampling capacitor and the integrating capacitor to a common voltage.

The plurality of second switched-capacitor circuits each has a first input terminal which is connected to the output of the first switched-capacitor circuit, a second input terminal, and an output. Each of the plurality of second switched-capacitor circuits further includes a comparator having a first and second input and an output; a first and second sampling capacitor; a first switching circuitry for selectively coupling the first input terminal to the first sampling capacitor and the second input terminal to the second sampling capacitor; and a second switching circuitry for selectively coupling the first sampling capacitor to a reference voltage and for selectively coupling the second sampling capacitor and the first and second input of the comparator to the common voltage.

The present disclosure also provides a method for summing signals in a switched-capacitor circuit having a first and second input terminal and an output. The method includes providing a comparator with a first and second input and an output; providing a first and second summing capacitor; connecting the first and second summing capacitor to the first and second input of the comparator, respectively; and selectively coupling the first and second summing capacitor to the first and second input terminal, respectively, by a first switching circuitry. The method further includes controlling the first switching circuitry by a first set of switching signals; selectively coupling the first summing capacitor to a reference voltage, by a second switching circuitry; selectively coupling the second summing capacitor and the first and second input of the comparator to a common voltage, by the second switching circuitry; and controlling the second switching circuitry by a second set of switching signals.

The present disclosure also provides a sigma-delta modulator structure. The sigma-delta circuit includes an input summer having two inputs and an output, and a plurality of cascaded integrator stages, wherein a first integrator stage is connected to the output of the input summer. The sigma-delta modulator further includes a first switched-capacitor circuit having a first and second input terminal, wherein the first and second input terminal are connected to selected outputs of the plurality of cascaded integrator stages, and includes an operational amplifier having an input summing node and an output; a first and second sampling capacitor connected to the input summing node; an integrating capacitor connected to the output of the operational amplifier in a feedback loop. The first switched-capacitor circuit includes first and second switching circuitry. The first switching circuitry is for selectively coupling the first input terminal to the first sampling capacitor and for selectively coupling the second input terminal to the second sampling capacitor, and for selectively coupling the integrating capacitor to the input summing node. The second switching circuitry is for selectively coupling the first and second sampling capacitor and the integrating capacitor to a common voltage.

The sigma-delta modulator further includes a plurality of second switched-capacitor circuits arranged in parallel, wherein each second switched-capacitor circuit includes a first input terminal which is connected to the output of the first switched-capacitor circuit, a second input terminal, and an output. The second switched-capacitor circuits further include a comparator having two inputs and an output; a first and second sampling capacitor; a first switching circuitry for selectively coupling the first input terminal to the first sampling capacitor and the second input terminal to the second sampling capacitor; and a second switching circuitry for selectively coupling the first sampling capacitor to a reference voltage and for selectively coupling the second sampling capacitor and the first and second input of the comparator to the common voltage.

In some embodiments, the sigma-delta modulator also includes a data weighted averaging logic for providing a digital output; and a feedback loop including a digital to analog converter for feeding back an output of the comparator to the input summer.

In some embodiments, the sigma-delta modulator forms a portion of an analog to digital converter. In other embodiments, the sigma-delta modulator forms a portion of a digital to analog converter. In yet other embodiments, the second switched-capacitor summer of the sigma-delta modulator forms a portion of a direct-conversion TV tuner.

The foregoing outlines features of several embodiments so that those skilled in the art may better understand the aspects of the present disclosure. Those skilled in the art should appreciate that they may readily use the present disclosure as a basis for designing or modifying other methods and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
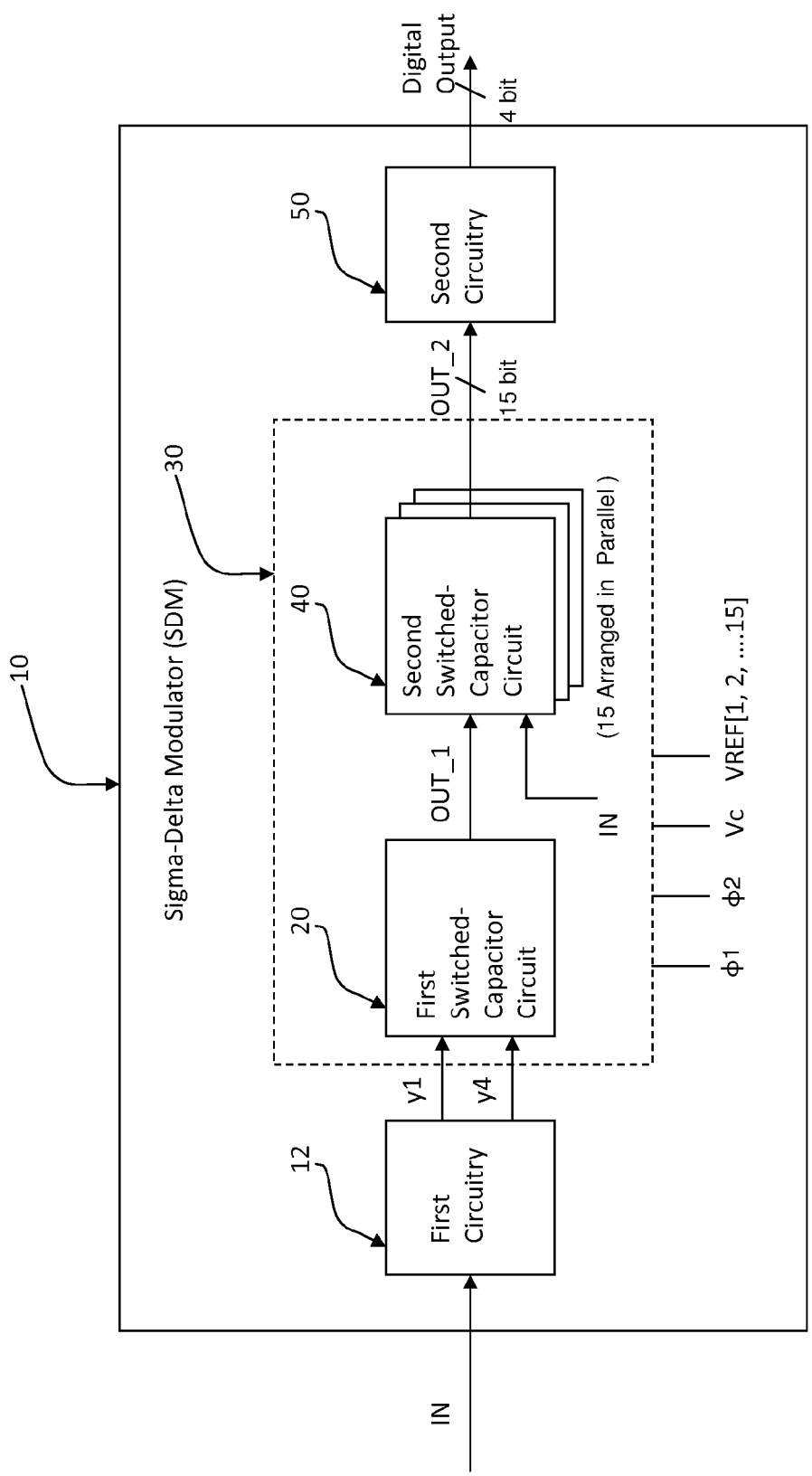
FIG. 1 is a block diagram of an exemplary sigma-delta modulator.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present disclosure.

The disclosure includes various embodiments of a switched-capacitor circuit which may be used in a sigma-delta modulator (SDM), which may be suitable for use by systems such as a direct-conversion TV tuner. The disclosed switched-capacitor circuit provides for methods and structures to improve linearity of the SDM output signal without any resulting significant gain decrease.

FIG. 1 is a block diagram of an exemplary SDM 10 that would benefit from one or more embodiments of the present invention. The SDM 10 includes a first circuitry 12 that receives an input signal IN and outputs two signals y1 and y4. In one embodiment, the first circuitry 12 includes cascaded integrator stages, as discussed further below with reference to FIG. 3. The output y1 and y4 are provided as inputs to a two-stage summer unit 30. The two-stage summer unit 30 includes a first switched-capacitor circuit 20 and a plurality of second switched-capacitor circuits 40 arranged in parallel. In one embodiment, the first switched-capacitor circuit 20 is configured to sum and amplify the two input signals y1 and y4 and provide an output signal OUT_1. The second switched-capacitor circuits 40 are configured to sum the output signal OUT_1 and the input signal IN (feed forward), perform a compare function against a reference voltage VREF, and provide output signals OUT_2. For the sake of further example, there are 15 second switched-capacitor circuits 40, producing a 15-bit output signal OUT_2. A second circuitry 50, among other things, receives the output signals OUT_2 and provides a multi-bit (e.g., 4-bit) digital output. As further shown in FIG. 3, an exemplary embodiment of an SDM may include many other components.

In some embodiments the reference voltage VREF may be a set of voltages generated, for example, by a ladder of resistors. In some embodiments the input signal IN may be a negative representation of the analog input signal. Embodiments with more than two inputs to the first switched-capacitor circuit 20 are contemplated by the present disclosure, which should not be seen as limiting the number of inputs of the first switched-capacitor circuit 20 in any way. Likewise, embodiments with more than two inputs to the second switched-capacitor circuit 40 are contemplated by the present disclosure, which should not be seen as limiting the number of inputs of the second switched-capacitor circuit 40 in any way.

Figure 2:
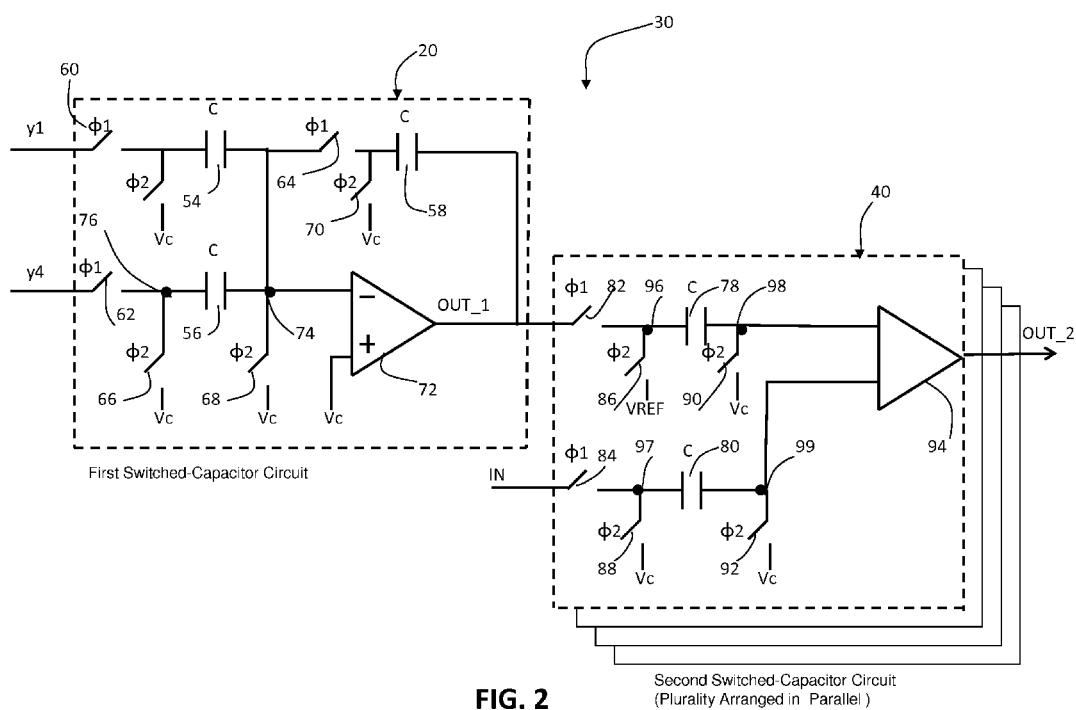
FIG. 2 is an electrical schematic diagram of an exemplary two-stage switched-capacitor summer.

FIG. 2 illustrates an exemplary electrical schematic diagram of the two-stage summer unit 30, shown in the FIG. 1 block diagram, according to one embodiment of the present invention. As shown, the first switched-capacitor circuit 20 includes: two input signals y1 and y4; two sampling capacitors 54 and 56; one integrating capacitor 58; three switches 60, 62 and 64 which are controlled by a first set of switching signals; three switches 66, 68 and 70 which are controlled by a second set of switching signals; and an operational amplifier (OpAmp) 72. some embodiments of the present invention, the first and second switching signals operate at different operational phases from each other, phase 1 ($\phi 1$) and phase 2 ($\phi 2$), respectively.

Input y1, of the first switched-capacitor circuit 20 is selectively coupled to a plate of the sampling capacitor 54 by switch 60. The other plate of the sampling capacitor 54 is connected to the sampling capacitor 56 and the inverting input terminal of the OpAmp 72, at an input summing node 74. The input summing node 74 is selectively coupled to the integrating capacitor 58 in a feedback loop, by switch 64. The input y4 is selectively coupled to the other plate of the sampling capacitor 56 by switch 62, at an input node 76. The input node 76, the input summing node 74, and the integrating capacitor 58 are selectively coupled to a common voltage Vc by switches 66, 68, and 70, respectively. The inverting input of the OpAmp 72 is connected to the input node 76 and the non-inverting input of the OpAmp 72 is connected to the common voltage Vc. The output of the OpAmp 72, is connected to the other plate of the integrating capacitor 58 and is selectively coupled to the second switched-capacitor circuit 40, by switch 82.

With continued reference to FIG. 2, the second switched-capacitor circuit 40 includes: two input signals, OUT_1 and IN; two sampling capacitors 78 and 80; two switches 82 and 84 which are controlled by a first set of switching signals; four switches 86, 88, 90 and 92 which are controlled by a second set of switching signals; and a comparator 94 with two inputs. In a certain embodiment of the present invention, the first and second switching signals operate at different operational phases from each other, phase 1 ($\phi1$) and phase 2 ($\phi2$), respectively.

The inputs of the second switched-capacitor circuit 40, OUT_1 and IN, are selectively coupled to the sampling capacitors 78 and 80 by switches 82 and 84 at input nodes 96 and 97, respectively. The other plates of the sampling capacitors 78 and 80 are connected with the input terminals of the comparator 94, at sampling nodes 98 and 99, respectively. The input node 97 and the sampling nodes 98 and 99 are selectively coupled to the common voltage Vc by the switches 88, 90, and 92, respectively. The reference voltage VREF is selectively coupled to the input node 96 by the switch 86. The second switched-capacitor circuit 40 outputs signal OUT_2.

During operation, in phase 1 ($\phi1$), the first switched-capacitor circuit 20 input signals, y1 and y4, are selectively sampled by the switches 60 and 62, onto the sampling capacitors 54 and 56, respectively. Additionally, the charge is transferred to the input summing node 74 and the inverting input of the OpAmp 72. The switch 64 transfers the charge to the integrator capacitor 58 in a feedback loop. The non-inverting input of the OpAmp 72 is set to the common voltage Vc. The OpAmp 72 outputs signal OUT_1.

Further, in phase 1 ($\phi1$), the second switched-capacitor circuit 40 input signals, OUT_1 and IN, are selectively sampled by the switches 82 and 84 onto the sampling capacitors 50 and 52, respectively. The charge is then transferred to the sampling nodes 98 and 99 and the inputs of the comparator 94. The comparator 94 outputs signal OUT_2.

During operation, in phase 2 ($\phi2$), the first switched-capacitor circuit 20 input node 76, the input summing node 74, and the integrating capacitor 58, are brought to the common voltage Vc by switches 66, 68, and 70, respectively. As previously disclosed, the inverting input of the OpAmp 72 is connected to the input summing node 74 and the non-inverting input of the OpAmp 72 is connected to the common voltage Vc. The OpAmp 72 generates the output signal OUT_1.

Further, in phase 2 ($\phi2$), the second switched-capacitor circuit 40 input node 96 is selectively connected to the reference voltage VREF by switch 86. The input node 97 is selectively connected to the common voltage Vc by switch 88. The two sampling nodes 98 and 99, and the two inputs of the comparator 94 are selectively connected to the common voltage Vc by switches 90 and 92, respectively. The comparator 94 outputs signal OUT_2.

Figure 3:
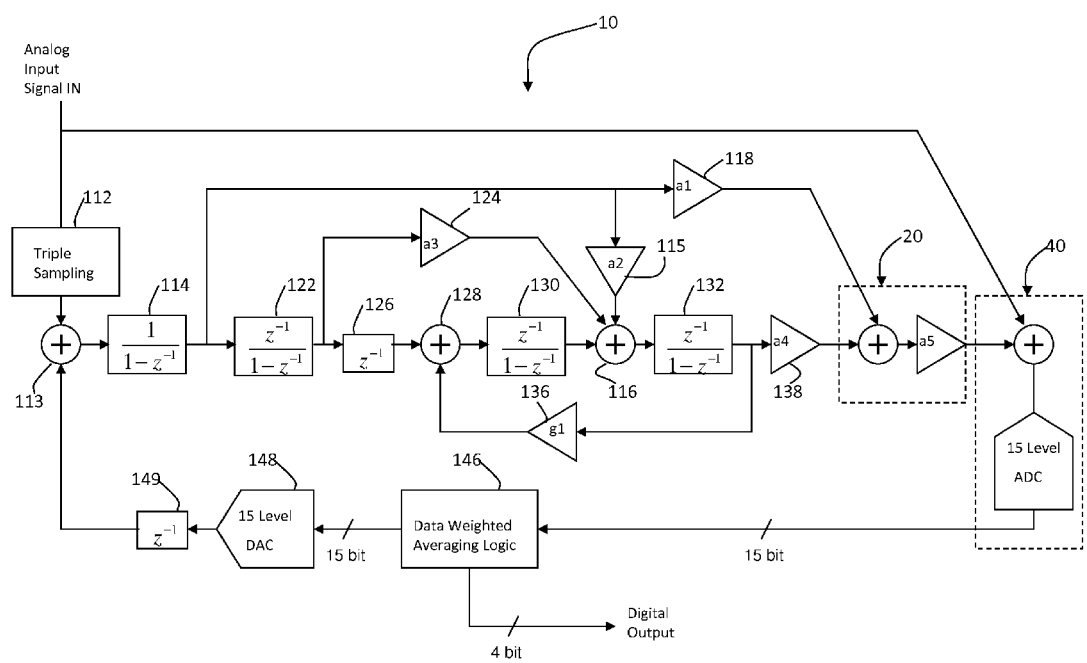
FIG. 3 is a block diagram of an exemplary fourth order loop-filter sigma-delta modulator.

FIG. 3 is an exemplary fourth order loop-filter sigma-delta modulator (SDM) 10, and is provided as a more-specific example of the SDM shown in FIG. 1. It is understood that the example of FIG. 3 is not intended to limit the invention to any particular configuration, except as explicitly recited in the following claims. As will be readily appreciated by those of ordinary skill in this particular art, various implementations of the SDM 10 are possible, including those disclosed in the article: "A 100 MS/s 4 MHz Bandwidth 70 dB SNR ΔΣ ADC in 90 nm CMOS" by Fujimoto, et al., IEEE Journal of Solid-State Circuits, Vol., 44. No. 6, June 2009, which is hereby incorporated by reference.

With continued reference to FIG. 3, during operation, the SDM 10 analog input signal IN is sampled by a sampling circuit 112 after which the sampled signal is added by a summer 113 to a system feedback signal. The summer 113 output is passed to a first integrator 114 which passes its output signal through a gain stage (amplifier) 115 to a summer 116. Additionally, the first integrator 114 output is passed through a gain stage 118 to the first switched-capacitor circuit 20. The output from the second integrator 122 is passed through a gain stage 124 to the summer 116. Additionally, the output from the second integrator 122 is passed through a delay stage 126 to a summer 128. The summer 128 output is passed to a third integrator 130 which passes its output to the summer 116. The summer 116 output is passed to the fourth integrator 132 which feds back its output to the summer 128 through a gain stage 136. Additionally, the fourth integrator 132 output is passed through a gain stage 138 to the first switched-capacitor circuit 20. As disclosed above, the first switched-capacitor circuit 20 receives the two inputs, selected from the cascaded integrator stages, and outputs OUT_1 to the second switched-capacitor circuit 40. The second switched-capacitor circuit 40 has a direct feed-forward path connection from the analog input and thereby receives signal IN. The second switched-capacitor circuit 40 output, signal OUT_2, is passed to the data weighted averaging logic 146 which outputs a 4 bit digital signal. Additionally, the output from the second switched-capacitor circuit 40 is fed back to the inverting input of the summer 113 through a digital to analog converter (DAC) 148 and a delay stage 149.

Although an embodiment of present invention and its advantages have been described in detail, it should be understood that various changes, substitutions and alterations can be made herein without departing from the spirit and scope of the present invention as defined by the appended claims. Therefore, the foregoing detailed description is to be clearly understood as being given by way of illustration and example only, the spirit and scope of the present invention being limited solely by the appended claims.

What is claimed is:

1. A switched-capacitor circuit comprising:
   a comparator having first and second input terminals and an output;
   a first circuit connected to the first input terminal, and including first, second, and third switches and a first capacitor, wherein the first switch is connected between a first node of the first capacitor and a common voltage, the first node of the first capacitor also being connected to the first input, the second switch is connected between a second node of the first capacitor and a reference voltage, and the third switch is connected between the second node of the first capacitor and a first input of the switched-capacitor circuit; and
   a second circuit connected to the second input terminal, and including fourth, fifth, and sixth switches and a second capacitor, wherein the fourth switch is connected between a first node of the second capacitor and the common voltage, the first node of the second capacitor also being connected to the second input, the fifth switch is connected between a second node of the second capacitor and the common voltage, and the sixth switch is connected between the second node of the second capacitor and a second input of the switched-capacitor circuit;

wherein, the first, second, fourth and fifth switches are controlled by a first set of switching signals.

2. The circuit of claim 1 wherein the third and sixth switches are controlled by a second set of switching signals.

3. The circuit of claim 1 wherein the first input of the switched-capacitor circuit is provided from an output of another switched-capacitor circuit.

4. The circuit of claim 2 wherein the first and second switching signals operate at different operational phases from each other.

5. The circuit of claim 1 wherein the first set of switching signals are commonly sourced.

6. The circuit of claim 2 wherein the first set of switching signals are commonly sourced and the second set of switching signals are commonly sourced.

7. The circuit of claim 1 wherein the second input of the switched-capacitor circuit is an analog input signal.

8. A two-stage switched-capacitor circuit comprising:
a first switched-capacitor circuit having first and second input terminals and an output, and further comprising:
an operational amplifier having an input summing node and an output;
a first and second sampling capacitor connected to the input summing node;
an integrating capacitor connected to the output of the operational amplifier in a feedback loop;
a first switching circuitry for selectively coupling the first input terminal to the first sampling capacitor and for selectively coupling the second input terminal to the second sampling capacitor, and for selectively coupling the integrating capacitor to the input summing node; and
a second switching circuitry for selectively coupling the first and second sampling capacitor and the integrating capacitor to a common voltage;
a plurality of second switched-capacitor circuits arranged in parallel, wherein each second switched-capacitor circuit has a first input terminal, which is connected to the output of the first switched-capacitor circuit, a second input terminal, and an output, and further comprising:
a comparator having two inputs and an output;
a first and second sampling capacitor;
a first switching circuitry for selectively coupling the first input terminal to the first sampling capacitor and the second input terminal to the second sampling capacitor; and
a second switching circuitry for selectively coupling the first sampling capacitor to a reference voltage and for selectively coupling the second sampling capacitor and the first and second input of the comparator to the common voltage.

9. The circuit of claim 8 wherein the first switching circuitry of the first switched-capacitor circuit and the first switching circuitry of the second switched-capacitor circuit are controlled by a first set of switching signals.

10. The circuit of claim 9 wherein the second switching circuitry of the first switched-capacitor circuit and the second switching circuitry of the second switched-capacitor circuit are controlled by a second set of switching signals.

11. The circuit of claim 10 wherein the first and second switching signals operate at different operational phases from each other.

12. The circuit of claim 9 wherein the first set of switching signals are commonly sourced.

13. The circuit of claim 10 wherein the first set of switching signals are commonly sourced and the second set of switching signals are commonly sourced.

14. The circuit of claim 8 wherein the first and second input signals of the first switched-capacitor circuit are selected from outputs of a plurality of cascaded integrators.

15. The circuit of claim 8 wherein the second input of the second switched-capacitor circuit is an analog input signal.

16. The circuit of claim 8 wherein the reference voltage is a set of voltages generated by a ladder of resistors.

17. The circuit of claim 8 wherein the two-stage switched-capacitor circuit forms a portion of a sigma-delta modulator.

18. The circuit of claim 8 wherein the two-stage switched-capacitor circuit forms a portion of an analog to digital converter.

19. A method for summing a plurality of signals in a switched-capacitor circuit having a first and second input terminal and an output, and further including a comparator having a first and second input and an output, and a first and second summing capacitor, comprising the steps of:
connecting an output of the first and second summing capacitor to the first and second input of the comparator, respectively;
selectively coupling an input of the first and second summing capacitor to the first and second input terminal, respectively, by a first switching circuitry;
controlling the first switching circuitry by a first set of switching signals;
selectively coupling the input of the first summing capacitor to a reference voltage, by a second switching circuitry;
selectively coupling the input and the output of the second summing capacitor and the first and second input of the comparator to a common voltage, by the second switching circuitry; and
controlling the second switching circuitry by a second set of switching signals.

20. The method of claim 19 wherein the first and second switching signals operate at different operational phases from each other.

21. The method of claim 19 wherein the first set of switching signals are commonly sourced and the second set of switching signals are commonly sourced.

22. The method of claim 19 wherein the first input terminal of the switched-capacitor circuit is provided from an output of another switched-capacitor circuit.

23. The method of claim 19 wherein the second input terminal of the switched-capacitor circuit is an analog input signal.

24. A sigma-delta modulator comprising:
an input summer having two inputs and an output;
a plurality of cascaded integrator stages, wherein a first integrator stage is connected to the output of the input summer;
a first switched-capacitor circuit having a first and second input terminal which are which are connected to selected outputs of the plurality of cascaded integrator stages, and further comprising:
an operational amplifier having an input summing node and an output;
a first and second sampling capacitor connected to the input summing node;
an integrating capacitor connected to the output of the operational amplifier in a feedback loop;
a first switching circuitry for selectively coupling the first input terminal to the first sampling capacitor and for selectively coupling the second input terminal to the second sampling capacitor, and for selectively coupling the integrating capacitor to the input summing node; and a second switching circuitry for selectively coupling the first and second sampling capacitor and the integrating capacitor to a common voltage;

a plurality of second switched-capacitor circuits arranged in parallel, wherein each second switched-capacitor circuit has a first input terminal, which is connected to the output of the first switched-capacitor circuit, a second input terminal, and an output, and further comprising:

a comparator having two inputs and an output;

a first and second sampling capacitor;

a first switching circuitry for selectively coupling the first input terminal to the first sampling capacitor and the second input terminal to the second sampling capacitor; and a second switching circuitry for selectively coupling the first sampling capacitor to a reference voltage and for selectively coupling the second sampling capacitor and the first and second input of the comparator to the common voltage;

a data weighted averaging logic for providing a digital output; and a feedback loop including a digital to analog converter for feeding back an output of the comparator to the input summer.

25. The sigma-delta modulator of claim 24 wherein the sigma-delta modulator forms a portion of an analog to digital converter.

26. The sigma-delta modulator of claim 24 wherein the sigma-delta modulator forms a portion of a digital to analog converter.

27. The sigma-delta modulator of claim 24 wherein the second switched-capacitor summer forms a portion of a direct-conversion TV tuner.

* * * * *